(12) United States Patent
Wang et al.

(10) Patent No.: US 6,898,124 B1
(45) Date of Patent: May 24, 2005

(54) EFFICIENT AND ACCURATE SENSING CIRCUIT AND TECHNIQUE FOR LOW VOLTAGE FLASH MEMORY DEVICES

(75) Inventors: Zhigang Wang, Santa Clara, CA (US); Nian Yang, Mountain View, CA (US); Yue-Song He, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/678,446

(22) Filed: Oct. 3, 2003

(51) Int. Cl.[7] .............................................. G11C 16/06
(52) U.S. Cl. ................................ 365/185.21; 365/185.2
(58) Field of Search .................... 365/185.2, 185.21, 365/185.03, 185.33

(56) References Cited

U.S. PATENT DOCUMENTS

| | | | | |
|---|---|---|---|---|
| 5,422,854 A | * | 6/1995 | Hirano et al. ............... | 365/210 |
| 5,805,500 A | * | 9/1998 | Campardo et al. ........ | 365/185.2 |
| 5,886,925 A | * | 3/1999 | Campardo et al. ..... | 365/185.21 |
| 6,128,225 A | * | 10/2000 | Campardo et al. ........ | 365/185.2 |
| 6,324,098 B1 | * | 11/2001 | Condemi et al. ...... | 365/185.21 |

* cited by examiner

*Primary Examiner*—Son Mai
(74) *Attorney, Agent, or Firm*—Farjami & Farjami LLP

(57) ABSTRACT

An exemplary sensing circuit comprises a first transistor connected to a first node, where a target memory cell has a drain capable of being connected to the first node through a selection circuit during a read operation involving the target memory cell. The sensing circuit further comprises a decouple circuit which is connected to the first transistor. The decouple circuit includes a second transistor having a gate coupled to a gate of the first transistor. The decouple circuit further has a decouple coefficient (N) greater than 1. The drain of the second transistor is connected at a second node to a reference voltage through a bias resistor. With the arrangement, the drain of the second transistor generates a sense amp input voltage at the second node such that the sense amp input voltage is decoupled from the first node.

20 Claims, 3 Drawing Sheets

EFFICIENT AND ACCURATE SENSING CIRCUIT AND TECHNIQUE FOR LOW VOLTAGE FLASH MEMORY DEVICES

TECHNICAL FIELD

The present invention relates generally to the field of semiconductor devices. More particularly, the present invention relates to semiconductor memory devices.

BACKGROUND ART

Memory devices are known in the art for storing data in a wide variety of electronic devices and applications. A typical memory device comprises a number of memory cells. Often, memory cells are arranged in an array format, where a row of memory cells corresponds to a word line and a column of memory cells corresponds to a bit line, and where each memory cell defines a binary bit, i.e., either a zero ("0") bit or a one ("1") bit.

Typically, the state of a memory cell is determined during a read operation by sensing the current drawn by the memory cell. According to one particular embodiment, the current drawn by a particular memory cell is ascertained by connecting the drain terminal of the memory cell to a sensing circuit, where the source terminal of the memory cell is connected to ground, and the gate of the memory cell is selected. The sensing circuit attempts to detect the current drawn by the memory cell, and compares the sensed memory cell current against a reference current. If the sensed memory cell current exceeds the reference current, the memory cell is considered an erased cell (e.g., corresponding to a "1" bit). However, if the sensed memory cell current is below the reference current, the memory cell is considered a programmed cell (e.g., corresponding to a "0" bit).

In one type of high density memory device, each memory cell is capable of storing four different charge levels, wherein the current drawn by the memory cell corresponds to the charge level stored by the memory cell. In this way, each memory cell is capable of storing two binary bits, where, for example, a first charge level corresponds to "00," a second charge level corresponds to "01," a third charge level corresponds to "10" and a fourth charge level corresponds to "11." In practice, it is desirable to have the sensed memory cell current be greater than or less than the reference current by a sufficient margin (also referred to as the "sense margin" in the present application) so as to accurately identify the charge level stored by the memory cell. However, when high density memory devices are implemented with a low supply voltage ("VCC"), such as 1.8 volts, for example, the sense margin is significantly reduced. When the read margin is significantly reduced, the reliability of sensing the memory cell current also decreases. The reliability and accuracy of the read operation are thus reduced, resulting in poor performance of the memory device. Accordingly, there exists a strong need in the art to overcome deficiencies of known sensing circuits and to provide an efficient and accurate sensing circuit and technique for low voltage flash memory device.

SUMMARY

The present invention addresses and resolves the need in the art for an efficient and accurate sensing circuit and technique for low voltage flash memory devices. The invention also resolves the need in the art for a sensing circuit which improves the sense margin for low voltage flash memory devices during read memory operations.

According to one exemplary embodiment, a sensing circuit for sensing the current drawn by a target memory cell, comprises a first transistor, such as a first PFET, connected to a first node, where the target memory cell has a drain capable of being connected to the first node through a selection circuit during a read operation involving the target memory cell. The target memory cell draws a target memory cell current when activated during the read operation. The sensing circuit further comprises a decouple circuit which is connected to the first transistor. The decouple circuit includes a second transistor, such as a second PFET, having a gate coupled to a gate of the first transistor. The decouple circuit further has a decouple coefficient (N) greater than 1, where, for example, the gate of the second transistor is N times wider than the gate of the first transistor. Furthermore, the decouple circuit draws a mirror current N times larger than the target memory cell current. The drain of the second transistor is connected at a second node to a reference voltage, such as ground, through a bias resistor. With the arrangement, the drain of the second transistor generates a sense amp input voltage at the second node such that the sense amp input voltage is decoupled from the first node. As a result, the sense margin for sensing target memory cell current is significantly increased, and the accuracy of the memory device is significantly improved.

According to one embodiment, the target memory cell is capable of storing four charge levels. In this particular embodiment, the four charge levels comprise a first charge level drawing approximately 0 microamperes during the read operation, a second charge level drawing approximately 10 microamperes during the read operation, a third charge level drawing approximately 15 microamperes during the read operation, and a fourth charge level drawing approximately 20 microamperes during the read operation.

Other features and advantages of the present invention will become more readily apparent to those of ordinary skill in the art after reviewing the following detailed description and accompanying drawings.

DETAILED DESCRIPTION OF THE INVENTION

The present invention is directed to an efficient and accurate sensing circuit and technique for low voltage flash memory device. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
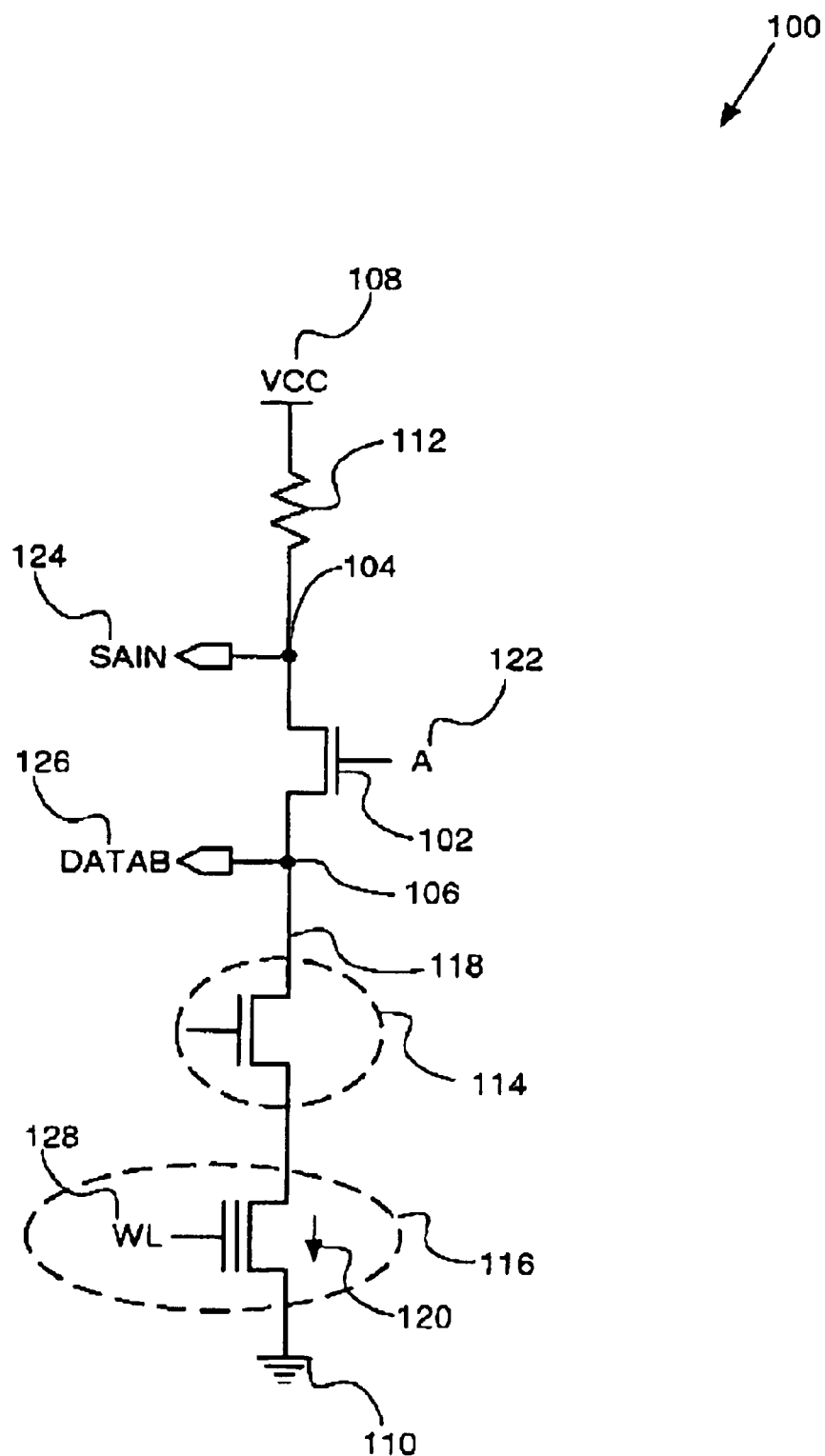
FIG. 1 depicts a circuit diagram of a known sensing circuit.

To illustrate the features and advantages of the present invention, a brief description of known sensing circuit 100 is provided with reference to FIG. 1. Typically, known sensing circuit 100 is part of a larger circuit arrangement (not shown) which itself may be part of a memory device.

In FIG. 1, known sensing circuit 100 is shown in simplified form and comprises transistor 102 having a drain connected at node 104 to supply voltage (VCC) 108 through resistor 112 and a source connected at node 106 to target memory cell 116 through selection circuit 114. As shown in FIG. 1, selection circuit 114 connects node 106 to the drain of target memory cell 116 via line 118 during a read operation involving target memory cell 116. The source of target memory cell 116 is coupled to ground 110.

During a read operation involving target memory cell 116, voltage A 122 is supplied to the gate of transistor 102, selection circuit 114 connects node 106 to the drain of target memory cell 116, and wordline (WL) 128 is supplied to the gate of target memory cell 116 activating target memory cell 116, which draws target memory cell current 120 along line 118. In FIG. 1, voltage A 122 is supplied to the gate of transistor 102 during this operation, such that voltage level DATAB 126 generated at node 106 is generally fixed, and sense amp input voltage ("SAIN") 124 generated at node 104 corresponds to target memory cell current 120 drawn by target memory cell 116. For example, in the case where target memory cell 116 is an erased cell, high target memory cell current 120 results in SAIN 124 being very close to the voltage at DATAB 126. As another example, in the case where target memory cell 116 is a programmed cell, low target memory cell current 120 results in SAIN 124 being very close to VCC 108. As such, the voltage range of SAIN 124 generated by known sensing circuit 100 is relatively small, namely between DATAB 126 and VCC 108. As VCC 108 is lowered to accommodate reduced voltage requirements in certain applications, the voltage range of SAIN 124 is further reduced, resulting in significantly reduced sense margins. This problem of reduced sense margins becomes even more pronounced in high density memory devices where each memory cell is capable of storing multiple charge levels.

Figure 2:
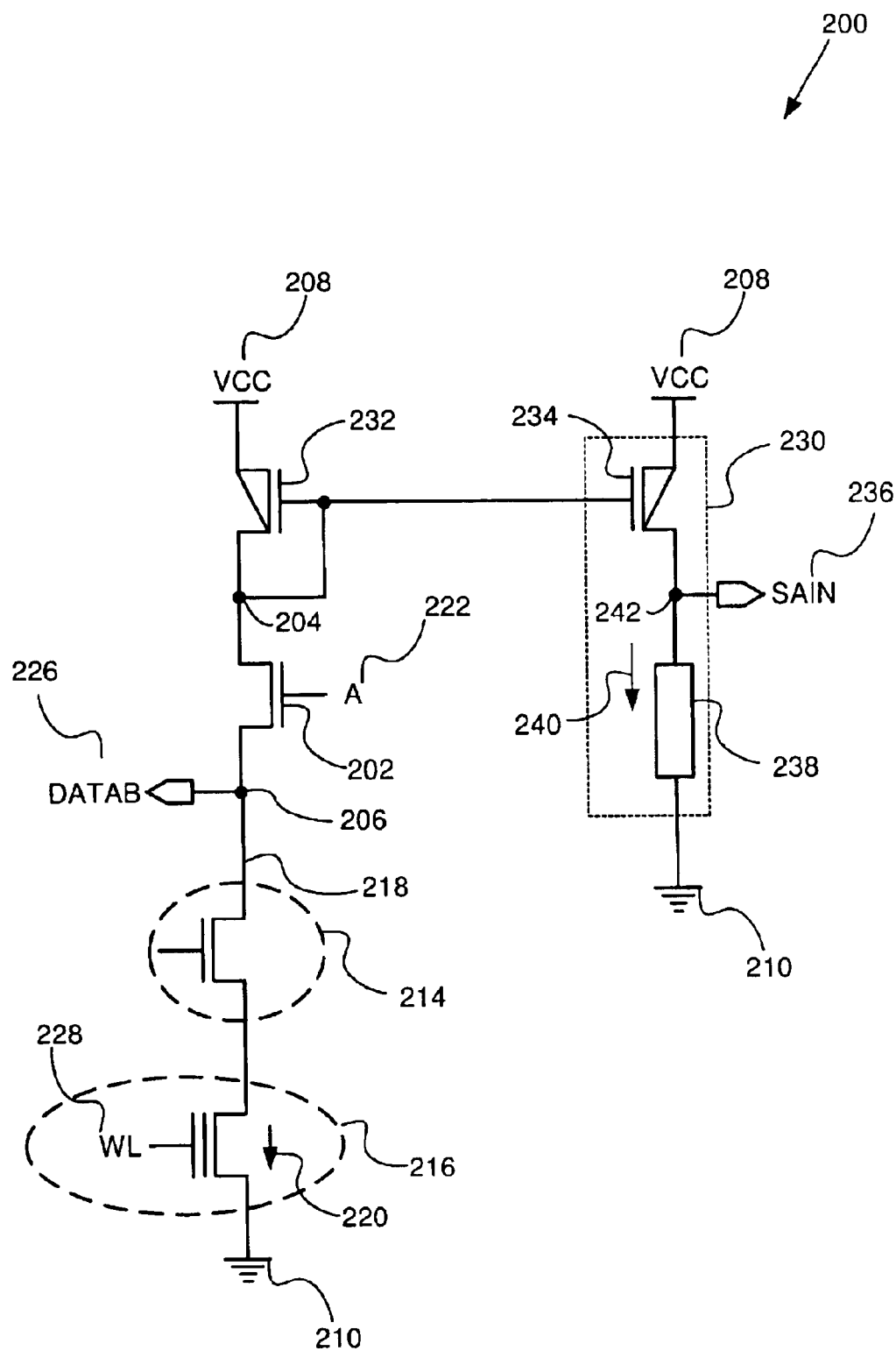
FIG. 2 depicts a circuit diagram of an exemplary sensing circuit in accordance with one embodiment of the present invention.

Referring now to FIG. 2, there is shown a circuit diagram of exemplary sensing circuit 200 according to one embodiment of the present invention. Sensing circuit 200 can be part of a larger circuit arrangement (not shown) which itself may be part of a memory device. For example, sensing circuit 200 may be used for multi-level charge ("MLC") flash memory devices. To illustrate the features of the invention, reference will be made to exemplary memory cells capable of storing four different charge levels, wherein the current drawn by the memory cell corresponds to the charge level stored by the memory cell, where, for example, a first charge level corresponds to "00," a second charge level corresponds to "01," a third charge level corresponds to "10" and a fourth charge level corresponds to "11." In one particular embodiment, the first charge level draws approximately 0 microamperes (μA), the second charge level draws approximately 10 μA, the third charge level draws approximately 15 μA, and the fourth charge level draws 20 approximately μA. As discussed below, due to the particular arrangement of sensing circuit 200, sensing circuit 200 achieves efficient and accurate memory cell sensing for low voltage flash memory device.

As shown in FIG. 2, sensing circuit 200 comprises transistors 202 and 232 and decouple circuit 230. Decouple circuit 230 comprises transistor 234 and resistive load 238. Transistor 202 may comprise an n-channel FET (NFET), and each transistor 232 and 234 may comprise a p-channel FET (PFET). The source of PFET 232 is connected to supply voltage (VCC) 208, and the drain and gate of PFET 232 are coupled together at node 204. The drain of NFET 202 is also connected to node 204 and the source of NFET 202 is connected to node 206. As shown in FIG. 2, selection circuit 214 connects node 206 to the drain of target memory cell 216 via line 218 during a read operation involving target memory cell 216. The source of target memory cell 216 is coupled to ground 210.

As shown in FIG. 2, the gate of transistor 234 is coupled to the gate of transistor 232, the source of transistor 234 is coupled to VCC 208, and the drain of transistor 234 is connected to node 242. Node 242 is connected to ground 210 through resistive load 238, which may, for example, be a bias transistor.

In the arrangement shown in FIG. 2, decouple circuit 230 has a decouple coefficient N which corresponds to the gate of transistor 234 being N times wider than the gate of transistor 232. Furthermore, SAIN 236 generated at node 242 by decouple circuit 230 is decoupled from DATAB 226 at node 206. During a read operation involving target memory cell 216, voltage A 222 is supplied to the gate of transistor 202, selection circuit 214 connects node 206 to the drain of target memory cell 216, and wordline (WL) 228 is supplied to the gate of target memory cell 216 activating target memory cell 216, which draws target memory cell current 220 along line 218.

Due to the particular arrangement of sensing circuit 200 wherein decouple circuit 230 operates as a current mirror circuit and SAIN 236 is decoupled from DATAB 226, the sensing margin for detecting the state of target memory cell 216 is significantly improved. To illustrate this advantage, an examination of the sensing margins according to known sensing circuit 100 and to sensing circuit 200 according to the present invention is provided. With continuing reference to FIG. 1, SAIN 124 (also referred to as "SAIN$_1$") is given by:

$$SAIN_1 = VCC - Icore_1 \cdot RL \quad \text{(Equation 1)}$$

where Icore$_1$ is target memory cell current 120, and RL is the resistance of Resistor 112. Similarly, the sense amp reference voltage ("SAREF$_1$") corresponding to a reference current ("Iref$_1$") drawn by a reference memory cell (e.g., where the reference memory cell replaces target memory cell 116 and SAREF$_1$ replaces SAIN 124 in FIG. 1) is given by:

$$SAREF_1 = VCC - Iref_1 \cdot RL \quad \text{(Equation 2)}.$$

With Equations 1 and 2, the voltage margin ($\Delta v_1$) for known sensing circuit 100 is given by:

$$\begin{aligned}
\Delta v_1 &= |SAIN_1 - SAREF_1| \quad &\text{(Equation 3)}\\
&= (VCC - Icore_1 \cdot RL) - (VCC - Iref_1 \cdot RL)\\
&= RL(Icore_1 - Iref_1)\\
&= RL \cdot \Delta i_1
\end{aligned}$$

where $\Delta i_1$ is equal to (Icore$_1$−Iref$_1$) and corresponds to the current margin. For erased target memory cell 116, SAIN 124 is equal to or very close to DATAB 126 (also referred to as "DATAB$_1$"), and thus substituting DATAB$_1$ for SAIN$_1$ in Equation 1 and solving for RL yields:

$$RL = (VCC - DATAB_1)/IER \quad \text{(Equation 4)}$$

where IER is erased target memory cell current 120 drawn by erased target memory cell 116. Substituting Equation 4 into Equation 3 yields:

$$\Delta v_1 = (VCC - DATAB_1) \cdot (\Delta i_1/IER) \quad \text{(Equation 5)}.$$

Figure 3:
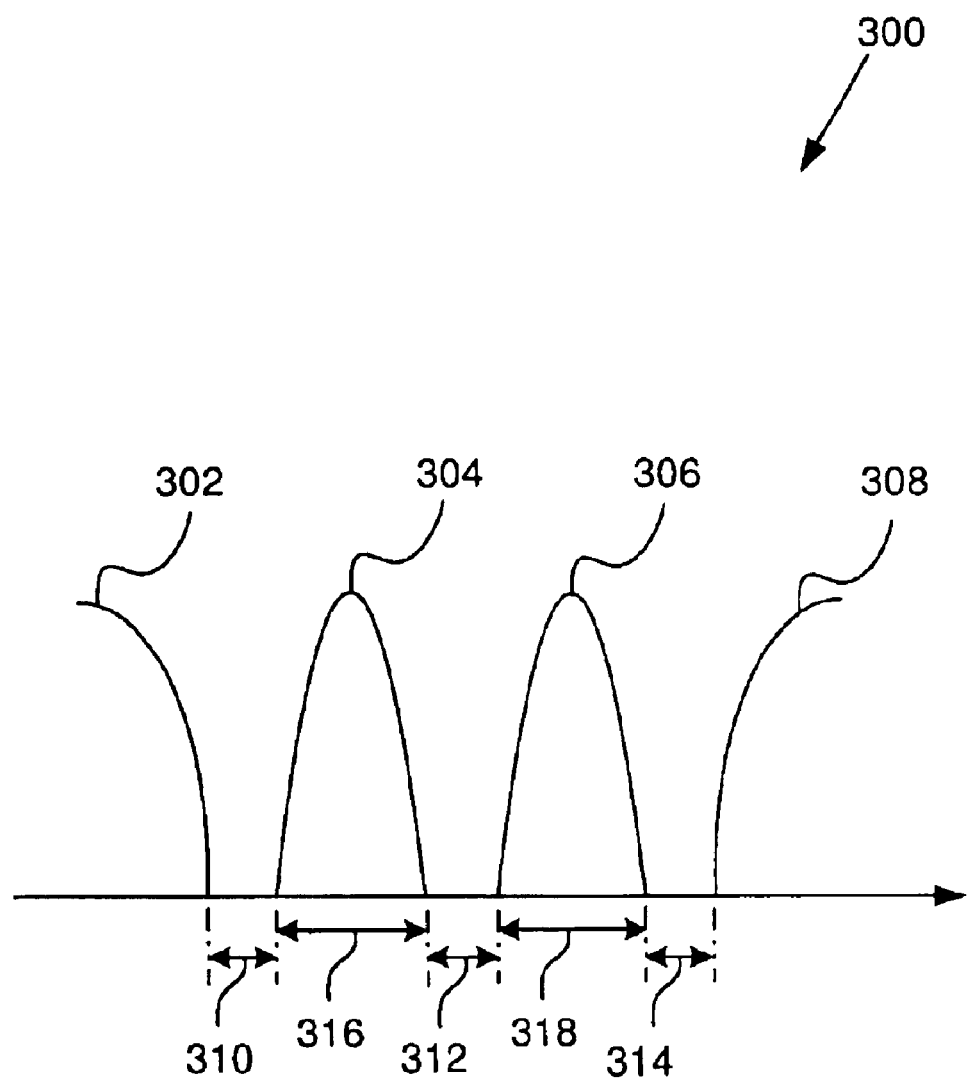
FIG. 3 depicts a graph showing distribution curves corresponding to a multi-level charge memory device.

With reference now to FIG. 3, graph 300 shows distribution curves 308, 306, 304 and 302 corresponding respectively to charge levels one, two, three and four, discussed above, where the horizontal axis corresponds to the current drawn by target memory cell 116 or target memory cell 216. As shown in FIG. 3, current window 310 corresponds to the current window between distribution curves 302 and 304, current window 312 corresponds to the current window between distribution curves 304 and 306, and current window 314 corresponds to the current window between distribution curves 306 and 308. Also shown in FIG. 3, current distribution width 318 corresponds to charge level two, and current distribution width 316 corresponds to charge level three. With continuing reference to FIG. 1, the maximum value for current margin ($\Delta i(\max)$) is given by:

$$\Delta i < \Delta i(\max) = (\Delta i w)/2 \quad \text{(Equation 6)}$$

where $\Delta iw$ is equal to the minimum of ($\Delta i1$, $\Delta i2$ and $\Delta i3$) and where $\Delta i1$, $\Delta i2$ and $\Delta i3$ respectively correspond to current window 310, current window 312 and current window 314 in FIG. 3. Substituting Equation 6 into Equation 5 yields:

$$\Delta v_1 = (VCC - DATAB_1) \cdot (\Delta iw/2IER) \quad \text{(Equation 7)}.$$

With continuing reference to FIG. 3, erased cell current IER is given by:

$$IER = \Delta iw1 + \Delta C2 + \Delta iw2 + \Delta C3 + \Delta iw3 \quad \text{(Equation 8)}$$

where $\Delta C2$ is current distribution width 316, and $\Delta C3$ is current distribution width 318. If the values of $\Delta iw1$, $\Delta iw2$ and $\Delta iw3$ are equal, Equation 8 can be re-written as:

$$IER = 3\Delta iw + \Delta C2 + \Delta C3 \quad \text{(Equation 9)}.$$

Solving for $\Delta iw$ in Equation 9 yields:

$$\Delta iw = \{IER - (\Delta C2 + \Delta C3)\}/3 \quad \text{(Equation 9')}.$$

Thus:

$$(\Delta iw/IER) = \{IER - (\Delta C2 + \Delta C3)\}/(3IER) \quad \text{(Equation 10)}$$
$$= \{1 - (\Delta C2 + \Delta C3)/IER\}/3.$$

Substituting Equation 10 into Equation 7 yields voltage margin for known sensing circuit 100:

$$\Delta v_1 = (VCC - DATAB_1) \cdot \{1 - (\Delta C2 + \Delta C3)/IER\}/6 \quad \text{(Equation 11)}.$$

With continuing reference to FIG. 2 which employs decouple circuit 230 as a current mirror circuit, SAIN 236 (also referred to as "SAIN$_2$") is given by:

$$SAIN_2 = Rb \cdot N \cdot IER \quad \text{(Equation 12)}$$

where Rb is the resistive value of resistive load 238, N is equal to the decouple coefficient of decouple circuit 230, and IER is erased target memory cell current 220 drawn by erased target memory cell 216. It is noted that current 240 drawn by decouple circuit 230 corresponds to (N·IER). SAIN 236 is also given by:

$$SAIN_2 = VCC - N \cdot IER \cdot Rload \quad \text{(Equation 13)}$$

where Rload is the resistive load across PFET 234. Similarly, the sense amp reference voltage ("SAREF$_2$") corresponding to a reference current ("Iref$_2$") drawn by a reference memory cell (e.g., where the reference memory cell replaces target memory cell 216 and SAREF$_2$ replaces SAIN 236 in FIG. 2) is given by:

$$SAREF_2 = VCC - Iref_2 \cdot Rload \quad \text{(Equation 14)}.$$

With Equations 13 and 14, the voltage margin ($\Delta v$) for sensing circuit 200 is given by:

$$\Delta v_2 = |SAIN_2 - SAREF_2| \quad \text{(Equation 15)}$$
$$= (VCC - N \cdot IER \cdot Rload) - (VCC - Iref_2 \cdot Rload)$$
$$= Rload(N \cdot IER - Iref_2).$$

For resistive load across PFET 334 equal to the resistive load across PFET 232, RL defined in Equation 4 (corresponding to the resistive load across PFET 232) substitutes for Rload in Equation 15 and yields:

$$\Delta v_2 = \{(VCC - DATAB_2)/IER\} \cdot (N \cdot IER - Iref_2) \quad \text{(Equation 16)}$$
$$= \{(VCC - DATAB_2)/IER\} \cdot \{(N-1)IER +$$
$$IER - Iref_2\}$$

where DATAB$_2$ corresponds to DATAB 226. Since the current margin ($\Delta i_2$) in sensing circuit 200 is (IER−Iref$_2$), the following is given:

$$\Delta v_2 = \{(VCC - DATAB_2)/IER\} \cdot \{(N-1)IER + \Delta i_2\} \quad \text{(Equation 17)}$$
$$= (VCC - DATAB_2) \cdot \{(N-1) + (\Delta i_2/IER)\}.$$

Substituting Equation 6 into Equation 17 yields:

$$\Delta v_2 = (VCC - DATAB_2) \cdot \{(N-1) + (\Delta iw/2IER)\} \quad \text{(Equation 18)}.$$

Substituting Equations 9 and 11 into Equation 18 yields:

$$\Delta v_2 = (VCC - DATAB_2) \cdot [(N-1) + \quad \text{(Equation 19)}$$
$$\{1 - (\Delta C2 + \Delta C3)/IER\}/6]$$
$$= (N-1)(VCC - DATAB_2) + (VCC - DATAB_2) \cdot$$
$$\{1 - (\Delta C2 + \Delta C3)/IER\}/6$$
$$= (N-1)(VCC - DATAB_2) + \Delta v_1$$

where DATAB$_2$ corresponds with DATAB$_1$.

From Equation 19, the voltage margin ($\Delta v_2$) for sensing circuit 200 is significantly increased over the voltage margin ($\Delta v_1$) for known circuit 100 where the decouple coefficient N of decouple circuit 230 is greater than 1. As discussed above, the present invention provides that gate width of PFET 234 be greater than the gate width of PFET 232, thereby providing a decouple coefficient N greater than 1 for decouple circuit 230. The particular arrangement of sensing circuit 200 significantly improves the voltage margin and results in improved accuracy for target memory cell sensing during read operations, particularly for low VCC 208 applications. Moreover, sensing circuit 200 can be readily implemented in flash memory device designs, thereby providing a simple and efficient solution. In sum, sensing circuit 200 provides significantly improved sensing margin during read operations, resulting in efficient and accurate memory cell sensing.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the types of transistors, resistive loads, and the particular voltages or voltage ranges referred to in the present application can be modified without departing from the scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, an efficient and accurate sensing circuit and technique for low voltage flash memory device have been described.

What is claimed is:

1. A sensing circuit for a target memory cell, said sensing circuit comprising:
    said target memory cell having a drain capable of being connected to a first node through a selection circuit during a read operation involving said target memory cell, said target memory cell drawing a target memory cell current when activated during said read operation;
    a first transistor being connected to said first node;
    a decouple circuit being connected to said first transistor, said decouple circuit including a second transistor having a gate width greater than a gate width of said first transistor, a gate of said second transistor being coupled to a gate of said first transistor, said decouple circuit further having a decouple coefficient (N) greater than 1, a drain of said second transistor being connected at a second node to a reference voltage through a bias resistor, said drain of said second transistor generating a sense amp input voltage at said second node such that said sense amp input voltage is decoupled from said first node.

2. The sensing circuit of claim 1 wherein said gate of said second transistor is N times wider than said gate of said first transistor.

3. The sensing circuit of claim 1 wherein said decouple circuit draws a mirror current N times larger than said target memory cell current.

4. The sensing circuit of claim 1 wherein said first transistor comprises a first PFET, and said second transistor comprises a second PFET, said gate of said first PFET connected to a drain of said first PFET, a source of said first PFET and a source of said second PFET being connected to a supply voltage.

5. The sensing circuit of claim 1 wherein said reference voltage is ground.

6. The sensing circuit of claim 1 wherein said target memory cell is capable of storing four charge levels.

7. The sensing circuit of claim 6 wherein said four charge levels comprises a first charge level drawing approximately 0 microamperes during said read operation, a second charge level drawing approximately 10 microamperes during said read operation, a third charge level drawing approximately 15 microamperes during said read operation, and a fourth charge level drawing approximately 20 microamperes during said read operation.

8. A multi-level charge memory device comprising:
    a target memory cell having a drain capable of being connected to a first node through a selection circuit during a read operation involving said target memory cell, said target memory cell drawing a target memory cell current when activated during said read operation; and
    a sensing circuit comprising a first transistor connected to a decouple circuit, said first transistor being connected to said first node, said decouple circuit including a second transistor having a gate width greater than a gate width of said first transistor, a gate of said second transistor being coupled to a gate of said first transistor, said decouple circuit further having a decouple coefficient (N) greater than 1, a drain of said second transistor being connected at a second node to a reference voltage through a bias resistor, said drain of said second transistor generating a sense amp input voltage at said second node such that said sense amp input voltage is decoupled from said first node.

9. The multi-level charge memory device of claim 8 wherein said gate of said second transistor is N times wider than said gate of said first transistor.

10. The multi-level charge memory device of claim 8 wherein said decouple circuit draws a mirror current N times larger than said target memory cell current.

11. The multi-level charge memory device of claim 8 wherein said first transistor comprises a first PFET, and said second transistor comprises a second PFET, said gate of said first PFET connected to a drain of said first PFET, a source of said first PFET and a source of said second PFET being connected to a supply voltage.

12. The multi-level charge memory device of claim 8 wherein said reference voltage is ground.

13. The multi-level charge memory device of claim 8 wherein said target memory cell is capable of storing four charge levels.

14. The multi-level charge memory device of claim 13 wherein said four charge levels comprises a first charge level drawing approximately 0 microamperes during said read operation, a second charge level drawing approximately 10 microamperes during said read operation, a third charge level drawing approximately 15 microamperes during said read operation, and a fourth charge level drawing approximately 20 microamperes during said read operation.

15. A sensing circuit for a target memory cell, said target memory cell having a drain capable of being connected to a first node through a selection circuit during a read operation involving said target memory cell, said target memory cell drawing a target memory cell current when activated during said read operation, a first transistor being connected to said first node, said sensing circuit being characterized by:
    a decouple circuit being connected to said first transistor, said decouple circuit including a second transistor having a gate width greater than a gate width of said first transistor, a gate of said second transistor being coupled to a gate of said first transistor, said decouple circuit further having a decouple coefficient (N) greater than 1, a drain of said second transistor being connected at a second node to a reference voltage through a bias resistor, said drain of said second transistor generating a sense amp input voltage at said second node such that said sense amp input voltage is decoupled from said first node.

16. The sensing circuit of claim 15 wherein said gate of said second transistor is N times wider than said gate of said first transistor.

17. The sensing circuit of claim 15 wherein said decouple circuit draws a mirror current N times larger than said target memory cell current.

18. The sensing circuit of claim 15 wherein said first transistor comprises a first PFET, and said second transistor comprises a second PFET, said gate of said first PFET connected to a drain of said first PFET, a source of said first PFET and a source of said second PFET being connected to a supply voltage.

19. The sensing circuit of claim 15 wherein said reference voltage is ground.

20. The sensing circuit of claim 15 wherein said target memory cell is capable of storing four charge levels.

\* \* \* \* \*